(12) United States Patent
Suzuki

(10) Patent No.: US 8,211,816 B2
(45) Date of Patent: Jul. 3, 2012

(54) COVER GLASS FOR SOLID-STATE IMAGING ELEMENT PACKAGE

(75) Inventor: Hidetoshi Suzuki, Shizuoka (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/276,780

(22) Filed: Oct. 19, 2011

(65) Prior Publication Data

US 2012/0035043 A1 Feb. 9, 2012

Related U.S. Application Data

(63) Continuation of application No. PCT/JP2010/057973, filed on May 11, 2010.

(30) Foreign Application Priority Data

May 13, 2009 (JP) ................................. 2009-116425

(51) Int. Cl.
*C03C 3/17* (2006.01)
*C03C 3/062* (2006.01)

(52) U.S. Cl. ................ 501/45; 501/24; 501/26; 501/47; 501/48; 501/73; 501/77; 501/79

(58) Field of Classification Search ............ 501/24, 501/26, 45, 47, 48, 73, 77, 79
See application file for complete search history.

(56) References Cited

U.S. PATENT DOCUMENTS

| | | | | |
|---|---|---|---|---|
| 4,698,318 A * | 10/1987 | Vogel et al. | ...................... | 501/10 |
| 6,093,484 A | 7/2000 | Oguma | | |
| 6,312,317 B1 | 11/2001 | Oguma | | |
| 6,566,289 B2 * | 5/2003 | Aronica et al. | ................. | 501/24 |
| 6,784,128 B2 * | 8/2004 | Otsuka et al. | .................. | 501/48 |
| 7,005,396 B2 * | 2/2006 | Espargilliere et al. | ......... | 501/24 |
| 7,151,064 B2 * | 12/2006 | Otsuka et al. | .................. | 501/44 |
| 7,189,672 B2 | 3/2007 | Aitken et al. | | |
| 2004/0087428 A1 * | 5/2004 | Otsuka et al. | .................. | 501/48 |
| 2005/0013873 A1 | 1/2005 | Fechner et al. | | |

FOREIGN PATENT DOCUMENTS

| | | | |
|---|---|---|---|
| JP | 61281043 | * | 12/1986 |
| JP | 08-306894 | | 11/1996 |
| JP | 10-330132 | | 12/1998 |
| JP | 2005-48170 | | 2/2005 |
| JP | 2005-353718 | | 12/2005 |
| JP | 2006-303954 | | 11/2006 |
| JP | 2007-516933 | | 6/2007 |

OTHER PUBLICATIONS

International Search Report issued Aug. 17, 2010 in PCT/JP2010/057973 filed May 11, 2010.
U.S. Appl. No. 13/178,795, filed Jul. 8, 2011, Suzuki.

* cited by examiner

*Primary Examiner* — Karl Group
(74) *Attorney, Agent, or Firm* — Oblon, Spivak, McClelland, Maier & Neustadt, L.L.P.

(57) ABSTRACT

A cover glass, containing, by mole percentage: 15 to 40% of $P_2O_5$; 15 to 30% of $Al_2O_3$; 0 to 15% of $SiO_2$; 0 to 20% of $B_2O_3$; 0 to 10% of $Li_2O$; 0 to less than 20% of $Na_2O$; 0 to less than 20% of $K_2O$, provided that $Li_2O+Na_2O+K_2O$ is in a range from 15 to less than 20%; and from 1 to 35% of $MgO+CaO+SrO+ZnO$. The cover glass being suitable for at least one selected from the group consisting of a solid-state imaging element package and an air-tight sealing of a resin package, and having a sufficient strength not to undergo breakage even when subjected to external force.

20 Claims, 1 Drawing Sheet

COVER GLASS FOR SOLID-STATE IMAGING ELEMENT PACKAGE

TECHNICAL FIELD

The present invention relates to a cover glass for a solid-state imaging element package, which is to be attached to a front surface of a resin package accommodating a solid-state imaging element and which protects the solid-state imaging element and is used also as a light-transmitting window.

BACKGROUND ART

A solid-state imaging element has such a structure that a LSI chip as a light receiving element is accommodated in a package; on its light-receiving surface, a color separation mosaic filter is overlaid and wire-bonded; and a package opening is sealed with a cover glass by means of an adhesive. The cover glass to be used here is required to have an optically uniform material property with little internal defects and a high transmittance property, in order to not only protect the LSI chip by the air-tight sealing, but also efficiently introduce light to the light-receiving surface. Further, the glass to be used for such an application should be free from cracking or distortion when it is sealed on the package. That is, the thermal expansion coefficient should be matched between the glass and the package material. As the package material, a ceramic such as alumina having an average thermal expansion coefficient of from 60 to $75 \times 10^{-7} K^{-1}$ has been used, and as a cover glass to match with it, a borosilicate glass having an average thermal expansion coefficient of from 45 to $75 \times 10^{-7} K^{-1}$ is available. Further, a $P_2O_5$—$Al_2O_3$ base glass containing CuO as an essential component, has been proposed as a window glass for a semiconductor package (Patent Document 1).

In recent years, for the purpose of weight reduction or cost reduction in imaging devices such as digital cameras, a study has been made to use a resin as a package material. The average thermal expansion coefficients of resin materials are from 110 to $180 \times 10^{-7} K^{-1}$ i.e. higher than of ceramics. Further, a resin package having the thermal expansion coefficient lowered by e.g. incorporating a large amount of $SiO_2$ powder to a resin, is also available, but even if such an additive is incorporated, the average thermal expansion coefficient of the resin package is at a level of at least $95 \times 10^{-7} K^{-1}$. Therefore, if the conventional borosilicate glass is applied to such a resin package, deformation of the package or peeling of the cover glass has been likely to occur, due to the large difference in the thermal expansion coefficient between the two.

Whereas, as a cover glass suitable for a resin package, a fluorophosphate glass has been proposed (Patent Document 2). This glass is a fluorophosphate glass having an average thermal expansion coefficient of from 120 to $180 \times 10^{-7} K^{-1}$ within a range of from 100 to 300° C. and thus is regarded as being excellent in the mounting property on a resin package.

Further, in a process for assembling an imaging device using a solid-state imaging element, after temporarily fixing a cover glass, the presence or absence of dust deposited on the surface of the light-receiving element is inspected on the basis of an output image information from the solid-state imaging element, and if the presence of dust is found, the temporarily fixed cover glass is dismounted from the package, and the solid-state imaging element is subjected to cleaning (Patent Document 3).

PRIOR ART DOCUMENTS

Patent Documents

Patent Document 1: JP-A-08-306894
Patent Document 2: JP-A-2005-353718
Patent Document 3: JP-A-2006-303954

DISCLOSURE OF INVENTION

Technical Problem

The fluorophosphate glass disclosed in Patent Document 2 has a problem relating to strength such that as compared with other glass composition systems to be used for optical glass, its glass strength is low, and when it is subjected to optical polishing, its edge is likely to be chipped and when an external force is exerted to the glass, breakage is likely to start from such chipped edge. Especially recently, in order to meet the demand for size reduction of e.g. digital cameras, a cover glass is often used in a thickness as thin as from about 0.3 to 0.5 mm, and the strength of the glass itself has come under close scrutiny.

Further, a cover glass for a solid-state imaging element package is air-tightly sealed on a package accommodating a solid-state imaging element, by means of an adhesive, and for the purpose of shortening the curing time of the adhesive, it has become common to use an ultraviolet-curable adhesive. The glass disclosed in Patent Document 1 or 2 contains CuO in glass for the purpose of shielding near infrared rays, but not only near infrared rays but also ultraviolet rays are thereby absorbed. Various types are available for the ultraviolet-curable adhesive, and one curable by ultraviolet rays having a wavelength of from 200 to 400 nm may be mentioned as an example. If such an ultraviolet-curable adhesive is used for adhesion between the cover glass containing CuO in glass and the package, a problem has been found anew such that the majority of radiated ultraviolet rays will be absorbed by the cover glass, and it takes a long time for curing the ultraviolet-curable adhesive.

Further, as disclosed in Patent Document 3, if the presence of dust deposited on the surface of the light-receiving element is found in the inspection in the process for producing an imaging device using a solid-state imaging element, the temporarily fixed cover glass is dismounted from the package, and the solid-state imaging element is subjected to cleaning, and therefore, the cover glass is required to have a sufficient strength not to undergo breakage when it is dismounted from the package.

The present invention has been made under the above-described circumstances, and it is an object of the present invention to provide a cover glass for a solid-state imaging element package, which is useful for air-tight sealing of a resin package and which has a sufficient strength not to undergo breakage even when subjected to an external force and also has a good weather resistance.

Solution to Problem

The present inventors have conducted an extensive study to accomplish the above object and, as a result, have found that a phosphate glass within a specific composition range is capable of solving the above-mentioned various problems as a cover glass for a resin package.

That is, the cover glass for a solid-state imaging element package of the present invention comprises, by mole percentage:
$P_2O_5$: 15 to 40%,
$Al_2O_3$: 15 to 30%,
$SiO_2$: 0 to 15%,
$B_2O_3$: 0 to 20%,
$Li_2O$: 0 to 15%,
$Na_2O$: 0 to 25%,
$K_2O$: 0 to 25%, provided that
$Li_2O+Na_2O+K_2O$: 15 to 40%, and
$MgO+CaO+SrO+ZnO$: 1 to 35%.

The cover glass for a solid-state imaging element package of the present invention preferably has an average thermal expansion coefficient of from 85 to $150\times10^{-7}K^{-1}$ within a range of from 50 to 250° C. and is preferably to be attached to a resin package.

A preferred embodiment of the cover glass for a solid-state imaging element package of the present invention, for example, comprises, by mole percentage:
$P_2O_5$: 15 to 40%,
$Al_2O_3$: 15 to 30%,
$SiO_2$: 0 to 15%,
$B_2O_3$: 0 to 20%,
$Li_2O$: 0 to 15%,
$Na_2O$: 0 to 25%,
$K_2O$: 0 to 25%, provided that
$Li_2O+Na_2O+K_2O$: 20 to 40%, and
$MaO+CaO+SrO+ZnO$: 1 to 35%.

The cover glass for a solid-state imaging element package having such a composition preferably has an average thermal expansion coefficient of from 100 to $150\times10^{-7}K^{-1}$ within a range of from 50 to 250° C.

Another preferred embodiment of the cover glass for a solid-state imaging element package of the present invention, for example, comprises, by mole percentage:
$P_2O_5$: 15 to 40%,
$Al_2O_3$: 15 to 30%,
$SiO_2$: 0 to 15%,
$B_2O_3$: 0 to 20%,
$Li_2O$: 0 to 10%,
$Na_2O$: 0 to less than 20%,
$K_2O$: 0 to less than 20%, provided that
$Li_2O+Na_2O+K_2O$: 15 to less than 20%, and
$MgO+CaO+SrO+ZnO$: 1 to 35%.

The cover glass for a solid-state imaging element package having such a composition preferably has an average thermal expansion coefficient of from 85 to $110\times10^{-7}K^{-1}$ within a range of from 50 to 250° C.

In this specification, unless otherwise specified, "to" is used to mean that the numerical values indicated before and after it are included as the lower limit value and the upper limit value.

The cover glass for a solid-state imaging element package of the present invention preferably contains substantially no CuO.

Advantageous Effects of Invention

According to the present invention, it becomes possible to provide a cover glass for a solid-state imaging element package, which is useful for air-tight sealing of a resin package and which has a sufficient strength not to undergo breakage even when subjected to an external force.

DESCRIPTION OF EMBODIMENTS

Figure 1:
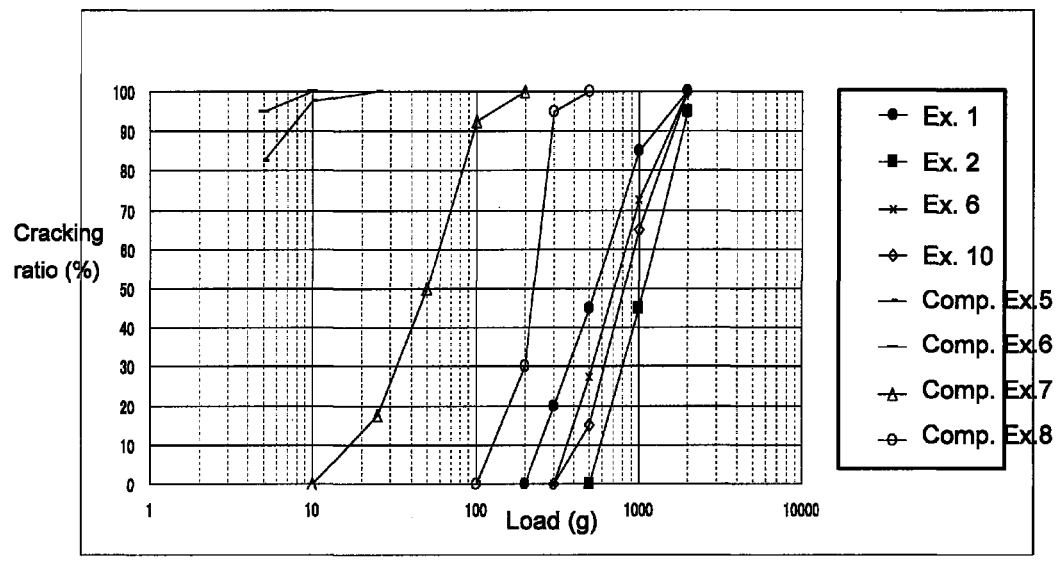
FIG. 1 is a graph showing a relation between the glass composition (high thermal expansion type composition) and the incidence of cracking.

Various materials may be used without any particular restriction for the resin package, to which the cover glass for a solid-state imaging element package of the present invention is to be attached. Specifically, it is possible to employ a thermosetting resin such as an epoxy resin, an imide resin, a polyimide resin, a silicone resin, an acrylic resin, a phenol resin or an unsaturated polyester resin, or a thermoplastic resin such as a polyphenylene sulfide resin or a polysulfone resin, and it is also possible to incorporate a curing agent, a release agent, a filler, etc., to such a resin material, as the case requires.

The average thermal expansion coefficient of the package made of such a resin material is from 95 to $180\times10^{-7}K^{-1}$, and the average thermal expansion coefficient of the cover glass is required to be similar to the average thermal expansion coefficient of such a resin material to avoid cracking or distortion when the cover glass is sealed on such a package. The cover glass of the present invention has an average thermal expansion coefficient of from 85 to $150\times10^{-7}K^{-1}$ within a range of from 50 to 250° C., which is similar to the average thermal expansion coefficient of the resin material, and thus, when attached to the package made of the resin material, it is capable of accomplishing air-tight sealing without bringing about cracking or distortion.

As described above, the present invention is applicable to a resin package of from 95 to $180\times10^{-7}K^{-1}$. However, in this specification, a cover glass having a thermal expansion coefficient of from 100 to $150\times10^{-7}K^{-1}$ which is preferably applicable to a resin package of from 100 to $160\times10^{-7}K^{-1}$, is specifically referred to as a high thermal expansion type composition, and a cover glass having a thermal expansion coefficient of from 85 to $110\times10^{-7}K^{-1}$ which is preferably applicable to a resin package of from 85 to $130\times10^{-7}K^{-1}$, is specifically referred to as a low thermal expansion type composition.

Further, the cover glass of the present invention is characterized in that it is made of a phosphate glass. As compared with a fluorophosphate glass, a phosphate glass has a high strength, and when it is subjected to optical polishing, its edge is less likely to be chipped. Therefore, even when an external force is exerted, breakage is less likely to start from its edge, and its strength is high. Further, even with the same phosphate glass, by adjusting the $P_2O_5$ component, the $Al_2O_3$ component and the alkali metal component to be within specific ranges, the glass strength can be made higher and the weather resistance can also be made higher.

Now, the reasons as to why the contents (by mole percentage) of the respective components constituting the cover glass of the present invention are defined as mentioned above, will be described.

$P_2O_5$ is an essential component to form a network structure of glass, but if it is less than 15%, the stability of glass tends to be poor, and if it exceeds 40%, the strength and the weather resistance tend to decrease. A preferred range of $P_2O_5$ is from 25 to 38% in the case of the after-mentioned high thermal expansion type composition wherein the total amount of $Li_2O$, $Na_2O$ and $K_2O$ is from 20 to 40%. Whereas, in the case of a low thermal expansion type composition wherein the total amount of $Li_2O$, $Na_2O$ and $K_2O$ is from 15 to less than 20%, a preferred range of $P_2O_5$ is from 25 to 35%.

$Al_2O_3$ is an essential component to improve the strength and weather resistance of glass, but if it is less than 15%, its effect cannot be obtained, and if it exceeds 30%, denitrification tends to be so strong that vitrification tends to be difficult. Its preferred range is from 17 to 27%, and its more preferred range is from 20 to 27%.

$SiO_2$ is a component to form a network structure of glass and has an effect to improve the weather resistance. However, if it exceeds 15%, vitrification tends to be difficult. Its preferred range is at most 12%.

$B_2O_5$ is a component to reinforce the structure of glass and to facilitate vitrification, but if it exceeds 20%, the weather resistance tends to decrease. Its preferred range is at most 15%.

$Li_2O$, $Na_2O$ and $K_2O$ are components to improve the melting properties and to mainly adjust the expansion coefficient, and at least one of them is required to be contained. If $Li_2O$ exceeds 15%, the weather resistance tends to decrease. If either $Na_2O$ or $K_2O$ exceeds 25%, the weather resistance tends to decrease. If the total amount of $Li_2O$, $Na_2O$ and $K_2O$ is less than 15% or exceeds 40%, the average thermal expansion coefficient of the cover glass may not be from 85 to $150 \times 10^{-7} K^{-1}$, and due to the difference in the thermal expansion coefficient from the resin package, deformation of the package or peeling of the cover glass may result.

With a view to increasing the thermal expansion coefficient of the cover glass, it is preferred, for example, to adjust $Li_2O$ to be from 0 to 15%, each of $Na_2O$ and $K_2O$ to be from 0 to 25%, and the total amount of $Li_2O$, $Na_2O$ and $K_2O$ to be from 20 to 40%, in the case of obtaining a cover glass with a high thermal expansion type composition. By adjusting the contents of the respective components and their total content to be within the above ranges, the average thermal expansion coefficient of the cover glass can be made to be high at a level of from 100 to $150 \times 10^{-7} K^{-1}$ within a range of from 50 to 250° C. In the case of preparing such a composition, with a view to obtaining good weather resistance while maintaining a high thermal expansion coefficient, it is preferred to adjust $Li_2O$ to be at most 12%, each of $Na_2O$ and $K_2O$ to be at most 20%, and the total amount of $Li_2O$, $Na_2O$ and $K_2O$ to be from 25 to 35%.

With a view to suppressing the thermal expansion coefficient of the cover glass to some extent and obtaining excellent weather resistance, it is preferred, for example, to adjust $Li_2O$ to be from 0 to 10%, each of $Na_2O$ and $K_2O$ to be from 0 to less than 20%, and the total amount of $Li_2O$, $Na_2O$ and $K_2O$ to be from 15 to less than 20%, in the case of obtaining a cover glass with a low thermal expansion type composition. By adjusting the contents of the respective components and their total content to be within the above ranges, the average thermal expansion coefficient of the cover glass can be made to be slightly lower than the above-mentioned cover glass with a high thermal expansion type composition, at a level of from 85 to $110 \times 10^{-7} K^{-1}$ within a range of from 50 to 250° C. Thus, it is possible to make one suitable for a resin package having the thermal expansion coefficient lowered by e.g. incorporating a large amount of $SiO_2$ powder in a resin. Further, it is possible to make one generally superior in the weather resistance as compared to the above-mentioned cover glass with a high thermal expansion type composition. In the case of preparing such a composition, with a view to further improving the weather resistance, it is preferred to adjust $Li_2O$ to be at most 7%, each of $Na_2O$ and $K_2O$ to be at most 15%, and the total amount of $Li_2O$, $Na_2O$ and $K_2O$ to be from 17 to 19%.

MgO, CaO, SrO and ZnO are components to improve the melting properties. It is not required that all of them are contained, i.e. at least optional one of them may be contained, and optional two or more of them may be contained as the case requires. If their total content is less than 1%, no effects will be obtainable, and if it exceeds 35%, devitrification tends to increase, such being undesirable. A preferred range is from 10 to 25%.

As other components, $La_2O_3$, $Y_2O_3$, $Gd_2O_3$, $Ta_2O_5$, $Yb_2O_3$, $TiO_2$, etc. may be contained.

As components constituting the cover glass of the present invention, it is preferred that BaO and $ZrO_2$ are not substantially contained. A solid-state imaging element makes a soft error by α-rays emitted from the cover glass, and it is necessary to minimize the amount of radioactive isotopes which emit α-rays, contained in the cover glass. The radioactive isotopes typically include U (uranium), Th (thorium) and Ra (radium). These elements are contained in very small amounts as impurities in the glass raw materials, but they are contained substantially in raw materials for BaO and $ZrO_2$. It is not impossible to separate radioactive isotopes from the raw materials for BaO and $ZrO_2$, but it is practically difficult to do so, since the production cost thereby substantially increases. Therefore, by making BaO and $ZrO_2$ not to be substantially contained as components constituting the cover glass, it is possible to prevent inclusion of the radioactive isotopes thereby to suppress the amount of α-rays emitted from the cover glass to be low.

As components constituting the cover glass of the present invention, it is preferred that CuO is not substantially contained. The cover glass is air-tightly sealed by means of an adhesive on a package accommodating a solid-state imaging element, and for the purpose of shortening the curing time of the adhesive, an ultraviolet-curable adhesive is used. Various types are available as the ultraviolet-curable adhesive, and one curable by ultraviolet rays having a wavelength of from 200 to 400 nm may be mentioned as an example. Whereas, if glass contains CuO, it absorbs near infrared wavelengths and ultraviolet wavelengths, whereby ultraviolet rays will not sufficiently reach the ultraviolet-curable adhesive, and it takes a long time for curing, thus leading to deterioration of the productivity in the process for assembling a solid-state imaging element package. Further, if glass contains CuO, it absorbs transmitted light in a visible region to some extent, whereby the amount of light reaching the solid-state imaging element decreases, thus leading to a problem such that the sensitivity of the solid-state imaging element decreases. For these reasons, it is preferred that the cover glass of the present invention contains substantially no CuO.

In this specification, "contains substantially no . . . " means that it is intended not to use such component as a raw material, and impurities unavoidably included from the raw material components or from the production process are deemed to be not substantially contained. Further, taking such unavoidable impurities into consideration, "not substantially contained" means that their content is at most 0.005 mass %, as calculated as oxides, based on the cover glass of the present invention.

The glass of the present invention can be prepared as follows. Firstly, raw materials are weighed and mixed so that the obtainable glass will be within the range of the above-mentioned composition. Such a raw material mixture is put in a platinum crucible and heated and melted at a temperature of from 1,100 to 1,400° C. in an electric furnace. Here, with respect to one with a high thermal expansion type composition wherein the total amount of $Li_2O$, $Na_2O$ and $K_2O$ is from 20 to 40%, it is preferred to carry out the heating and melting at a temperature of from 1,100 to 1,350° C., and with respect to one with a low thermal expansion type composition wherein the total amount of $Li_2O$, $Na_2O$ and $K_2O$ is from 15 to less than 20%, it is preferred to carry out the heating and melting at a temperature of from 1,200 to 1,400° C. After being sufficiently stirred and clarified, the molten glass is cast in a mold, annealed and then cut and polished to obtain a cover glass of flat plate form.

EXAMPLES

Now, the present invention will be described in further detail with reference to Examples.

Examples 1 to 12 and Comparative Examples 1 to 8

Average Thermal Expansion Coefficient, Emission of α-Rays, and Weather Resistance Examples 1 to 12 of the present invention and Comparative Examples 1 to 4 are shown in Tables 1 and 2. The glass compositions in the Tables are represented by mol %. Here, Examples 1 to 12 are cover glasses with high thermal expansion type compositions wherein $Li_2O$ is from 0 to 15%, each of $Na_2O$ and $K_2O$ is from 0 to 25%, and the total amount of $Li_2O$, $Na_2O$ and $K_2O$ is from 20 to 40%.

For such glasses, raw materials were weighed and mixed so that the compositions would be as shown in the Tables, and each raw material mixture was put in a platinum crucible having an internal volume of 300 cc, then melted, clarified and stirred at from 1,100 to 1,350° C. for from 1 to 3 hours, then cast in a rectangular mold of 50 mm in length×50 mm in width×20 mm in height preheated to from 300 to 500° C. and then annealed at a rate of about 1° C./min to obtain a sample. Each glass was visually observed at the time of preparing the sample to confirm that there were no bubbles or striae. The weather resistance, the emission of α-rays and the average thermal expansion coefficient were evaluated by the following methods.

For the weather resistance, glass of prescribed form (25 mm×25 mm×1 mm) having both surfaces subjected to optical polishing so that the thickness became 1 mm, was held under conditions of the temperature being 60° C. and the relative humidity being 90%, whereby the weather resistance was represented by the time until modification appeared on the surface of the glass. The emission of α-rays was measured by means of a low level α-ray measuring apparatus (LACS-4000M, manufactured by Sumitomo Chemical Co., Ltd.). For the average thermal expansion coefficient, glass obtained, was processed into a glass rod, and the average thermal expansion coefficient was measured by a thermal expansion method at a temperature raising rate of 5° C./min by means of a thermal analysis instrument (trade name: TMA8310, manufactured by Rigaku).

TABLE 1

|  | Ex. 1 | Ex. 2 | Ex. 3 | Ex. 4 | Ex. 5 | Ex. 6 | Ex. 7 | Ex. 8 |
| --- | --- | --- | --- | --- | --- | --- | --- | --- |
| $P_2O_5$ | 15.0 | 40.0 | 20.0 | 29.5 | 18.5 | 28.5 | 20.0 | 21.0 |
| $Al_2O_3$ | 15.0 | 22.0 | 30.0 | 20.5 | 20.0 | 17.5 | 30.0 | 24.0 |
| $SiO_2$ | 15.0 |  |  |  | 14.5 | 12.0 | 5.0 |  |
| $B_2O_3$ | 8.0 | 4.0 | 6.5 |  | 20.0 |  | 5.0 | 5.0 |
| $Li_2O$ |  | 1.0 |  | 15.0 |  | 5.0 |  | 15.0 |
| $Na_2O$ | 11.5 | 15.0 | 7.0 | 13.5 | 17.0 | 7.0 | 24.5 | 0.0 |
| $K_2O$ | 9.0 | 5.0 | 16.0 | 4.0 | 3.0 | 10.0 | 10.0 | 25.0 |
| $Li_2O + Na_2O + K_2O$ | 20.5 | 21.0 | 23.0 | 32.5 | 20.0 | 22.0 | 34.5 | 40.0 |
| MgO | 0.5 | 3.5 | 5.5 | 16.0 | 4.5 | 10.0 | 3.0 | 5.0 |
| CaO |  | 5.5 | 6.0 | 1.5 | 2.5 | 2.5 | 2.0 | 5.0 |
| SrO |  | 4.0 | 3.0 |  |  | 6.5 | 0.5 |  |
| ZnO | 26.0 |  | 6.0 |  |  | 1.0 |  |  |
| MgO + CaO + SrO + ZnO | 26.5 | 13.0 | 20.5 | 17.5 | 7.0 | 20.0 | 5.5 | 10.0 |
| BaO |  |  |  |  |  |  |  |  |
| $ZrO_2$ |  |  |  |  |  |  |  |  |
| Average thermal expansion coefficient ($\times 10^{-7} K^{-1}$) | 126 | 115 | 109 | 105 | 118 | 101 | 149 | 116 |
| Emission of α-ray ($c/cm^2 \cdot h$) | 0.002 | 0.005 | 0.004 | 0.002 | 0.001 | 0.004 | 0.003 | 0.002 |
| Weather resistance (h) | 1224 | 1368 | 1440 | 1296 | 1344 | 1320 | 1200 | 1392 |

TABLE 2

|  | Ex. 9 | Ex. 10 | Ex. 11 | Ex. 12 | Comp. Ex. 1 | Comp. Ex. 2 | Comp. Ex. 3 | Comp. Ex. 4 |
| --- | --- | --- | --- | --- | --- | --- | --- | --- |
| $P_2O_5$ | 16.5 | 35.0 | 23.5 | 31.1 | 32.7 | 26.8 | 47.8 | 45.0 |
| $Al_2O_3$ | 17.0 | 25.0 | 21.0 | 22.5 | 2.0 | 1.8 | 4.2 | 5.0 |
| $SiO_2$ | 5.5 | 1.0 |  |  |  |  |  | 5.0 |
| $B_2O_3$ | 6.0 | 6.0 | 2.0 | 5.4 |  | 8.9 | 1.6 |  |
| $Li_2O$ |  | 9.0 | 4.5 | 2.0 | 5.0 | 5.4 | 15.5 |  |
| $Na_2O$ | 18.0 | 22.0 | 19.0 | 18.5 | 7.9 | 6.3 | 7.5 | 21.0 |
| $K_2O$ | 2.0 |  |  | 8.5 | 4.0 | 6.3 | 7.1 |  |
| $Li_2O + Na_2O + K_2O$ | 20.0 | 31.0 | 23.5 | 29.0 | 16.9 | 18.0 | 30.1 | 21.0 |
| MgO | 6.0 | 1.0 |  | 3.0 | 4.0 | 34.5 |  |  |
| CaO | 7.0 | 1.0 | 11.0 | 4.0 | 4.0 |  | 1.2 | 21.0 |
| SrO |  |  | 7.5 | 0.5 |  |  |  |  |
| ZnO | 22.0 |  | 11.5 | 4.5 | 34.6 |  | 6.4 |  |

TABLE 2-continued

|  | Ex. 9 | Ex. 10 | Ex. 11 | Ex. 12 | Comp. Ex. 1 | Comp. Ex. 2 | Comp. Ex. 3 | Comp. Ex. 4 |
|---|---|---|---|---|---|---|---|---|
| MgO + CaO + SrO + ZnO | 35.0 | 2.0 | 30.0 | 12.0 | 42.6 | 34.5 | 7.6 | 21.0 |
| BaO |  |  |  |  | 5.8 | 10.0 | 7.9 |  |
| $ZrO_2$ |  |  |  |  |  |  | 0.8 | 3.0 |
| Average thermal expansion coefficient ($\times 10^{-7} K^{-1}$) | 132 | 130 | 142 | 134 | 126 | 131 | 135 | 121 |
| Emission of α-ray ($c/cm^2 \cdot h$) | 0.002 | 0.001 | 0.004 | 0.003 | 0.012 | 0.022 | 0.017 | 0.028 |
| Weather resistance (h) | 1368 | 1272 | 1176 | 1224 | 720 | 672 | 600 | 768 |

As is evident from Tables 1 and 2, glasses in Comparative Examples 1 to 4 are poor in the weather resistance at a level of less than 800 hours, as compared with glasses in Examples 1 to 12. A reason is considered to be such that $Al_2O_3$ component in glass is less. Further, another reason is considered to be such that $P_2O_5$ component is excessive in Comparative Examples 3 and 4. Further, the glasses in Comparative Examples 1 to 4 contain BaO or $ZrO_2$ in glass, and it is evident that the emission of α-rays from the glass is high as compared with the glasses in Examples.

[Strength of Glass, and UV-Permeability]

Further, the strength (cracking resistance) and the UV-permeability of glass were evaluated by the following methods.

Breakage of glass takes place when a crack (scar) formed on the surface or edge of glass extends. Accordingly, if cracking is prevented by improving cracking resistance of glass, it is considered possible to improve the strength at the time when an external force is exerted. Therefore, for evaluation of the strength of glass, the method for evaluation of cracking resistance of glass proposed by Wada et al was used (M. Wada et al, Proc., the Xth ICG., vol. 11, Ceram. Soc., Japan, Kyoto, 1974, p 39).

According to this method, sample glass is placed on a stage of a Vickers hardness tester, and a rhombic diamond indenter is pressed on the surface of the sample glass with various loads for 15 seconds. And the number of cracks formed from the four corners of the indentation by 15 seconds after unloading is counted, and its ratio to the maximum number (i.e. four) of cracks which can be formed, is obtained and taken as the cracking ratio. The cracking ratio being low at a high load means that cracking is less likely to take place i.e. the sample glass is excellent in cracking resistance. The cracking ratio was measured 10 times at the same load, and the average value was obtained. Further, the measurements were carried out under such conditions that the temperature was 25° C. and the humidity was 30%.

Cracking resistance was evaluated with respect to glasses in Examples 1, 2, 6 and 10, Comparative Example 5 (glass in Example 1 disclosed in JP-A-2005-353718), Comparative Example 6 (glass in Example 6 disclosed in JP-A-2005-353718), Comparative Example 7 (No. 2 glass of CuO-containing $P_2O_5$—$Al_2O_3$ base glass disclosed in JP-A-8-306894) and Comparative Example 8 (No. 3 glass of CuO-containing $P_2O_5$—$Al_2O_3$ base glass disclosed in JP-A-8-306894). The evaluation results are shown in FIG. 1. Further, the respective glass compositions in Comparative Examples 5 to 8 are shown in Table 3, as calculated by mol %.

TABLE 3

|  | Comp. Ex. 5 (mol %) | Comp. Ex. 6 (mol %) |  | Comp. Ex. 7 (mol %) | Comp. Ex. 8 (mol %) |
|---|---|---|---|---|---|
| $P_2O_5$ | 18.6 | 13.8 | $Al_2O_3$ | 2.3 |  |
| $AlF_3$ | 15.5 | 9.1 | $SiO_2$ | 70.3 | 72.7 |
| LiF | 28.2 | 24.7 | $B_2O_3$ | 16.3 | 13.5 |
| NaLF | 9.0 | 8.8 | $Li_2O$ | 1.5 |  |
| (LiF + NaF) | 37.2 | 33.5 | $Na_2O$ | 0.7 | 10.2 |
| $MgF_2$ | 3.7 | 6.1 | $K_2O$ | 5.5 | 1.1 |
| $CaF_2$ | 7.8 | 14.8 | ($Li_2O + Na_2O + K_2O$) | 7.7 | 11.3 |
| $SrF_2$ | 5.7 | 10.8 |  |  |  |
| $ZnF_2$ | 8.4 | 9.7 | MgO |  |  |
| ($MgF_2 + CaF_2 + SrF_2 + ZnF_2$) | 25.6 | 41.4 | CaO |  |  |
|  |  |  | SrO |  | 2.4 |
|  |  |  | ZnO | 3.2 |  |
| CuO | 3.1 | 2.2 | (MgO + CaO + SrO + ZnO) | 3.2 | 2.4 |
|  |  |  | $Sb_2O_3$ | 0.2 | 0.1 |

As is evident from FIG. 1, when the cracking ratios are compared between the glass of the present invention with a high thermal expansion type composition and the fluorophosphate glass (Comparative Example 5 or 6) disclosed in JP-A-2005-353718, no cracking is observed in the glass of the present invention under a load where the cracking ratio is high with the fluorophosphate glass in Comparative Example 5 or 6, thus indicating that the glass of the present invention has higher cracking resistance and higher strength.

Further, when the cracking ratios are compared between the glass of the present invention and the borosilicate glass (Comparative Example 7 or 8) disclosed in JP-A-8-306894, the cracking ratio is low with the glass of the present invention under a load where the cracking ratio is high with the borosilicate glass in Comparative Example 7 or 8, thus indicating that the glass of the present invention has higher cracking resistance and higher strength. That is, it has been confirmed that as compared with conventional glasses, the glass of the present invention has high strength and is less likely to undergo breakage at the time when an external force is exerted.

The UV permeability was evaluated by the time actually required for adhesion by using a resin package and an ultraviolet-curable adhesive.

With respect to glasses in Example 4 and Comparative Example 5 or 7, optical polishing on both sides was carried out to obtain rectangular substrates having a thickness of 0.5 mm. And, by means of a dispenser, an ultraviolet-curable adhesive was applied to a portion which is an opening of a package made of an epoxy resin and on which a cover glass is to be abutted. Then, a cover glass in Example 4 or Comparative Example 5 or 7 was placed on the opening of the package, and ultraviolet rays were radiated by an ultraviolet lamp from a side of the cover glass opposite to the side facing the package, to cure the ultraviolet-curable adhesive thereby to bond the cover glass to the package. At that time, the time required for the bonding of the cover glass, i.e. the time required for the curing of the ultraviolet-curable adhesive, was investigated.

In the case where the cover glass in Example 4 was used, the time required for the bonding of the cover glass was shorter by about 40% as compared with the case where the cover glass in Comparative Example 5 or 7 was used. This is considered to be such that since the glass in Comparative Example 5 or 7 contains CuO as a constituting component, the ultraviolet wavelengths required for curing of the ultraviolet-curable adhesive were absorbed by the glass, and the amount of ultraviolet rays reaching the ultraviolet-curable adhesive was less. Whereas, with the glass in Example 4 containing no CuO, there is no absorption of ultraviolet rays by the glass, and it is possible to readily cure the ultraviolet-curable adhesive and efficiently carry out the process for assembling the imaging device.

Examples 21 to 32, and Comparative Examples 21 to 24

Average Thermal Expansion Coefficient, Emission of α-Rays, and Weather Resistance Examples 21 to 32 of the present invention and Comparative Examples 21 to 24 are shown in Tables 4 and 5. The glass compositions in the Tables are represented by mol %. Here, Examples 21 to 32 are cover glasses with low thermal expansion type compositions wherein $Li_2O$ is from 0 to 10%, each of $Na_2O$ and $K_2O$ is from 0 to less than 20%, and the total amount of $Li_2O$, $Na_2O$ and $K_2O$ is from 15 to less than 20%.

For such glasses, raw materials were weighed and mixed so that the compositions would be as shown in the Tables, and each raw material mixture was put in a platinum crucible having an internal volume of 300 cc, then melted, clarified and stirred at from 1,200 to 1,400° C. for from 1 to 3 hours, then cast in a rectangular mold of 50 mm in length×50 mm in width×20 mm in height preheated to from 300 to 500° C. and then annealed at a rate of about 1° C./min to obtain a sample. Each glass was visually observed at the time of preparing the sample to confirm that there were no bubbles or striae. The weather resistance, the emission of α-rays and the average thermal expansion coefficient were evaluated by the above-described methods.

TABLE 4

|  | Ex. 21 | Ex. 22 | Ex. 23 | Ex. 24 | Ex. 25 | Ex. 26 | Ex. 27 | Ex. 28 |
|---|---|---|---|---|---|---|---|---|
| $P_2O_5$ | 20.3 | 31.1 | 15.2 | 36.5 | 33.0 | 24.7 | 30.8 | 40.0 |
| $Al_2O_3$ | 18.8 | 27.4 | 29.8 | 23.2 | 20.7 | 15.0 | 22.3 | 25.1 |
| $SiO_2$ | 10.0 |  |  |  | 6.5 | 14.7 | 5.5 |  |
| $B_2O_3$ |  | 4.2 | 15.0 |  | 19.6 | 11.3 |  |  |
| $Li_2O$ | 0.5 |  | 9.5 | 4.4 |  | 0.2 |  | 2.0 |
| $Na_2O$ | 5.4 | 19.6 | 7.7 |  | 12.9 | 11.8 |  | 9.5 |
| $K_2O$ | 10.2 |  |  | 13.6 | 6.1 | 5.9 | 17.5 | 8.3 |
| $Li_2O + Na_2O + K_2O$ | 16.1 | 19.6 | 17.2 | 18.0 | 19.0 | 17.9 | 17.5 | 19.8 |
| MgO |  | 9.4 | 10.5 |  | 1.2 | 4.2 | 7.6 |  |
| CaO | 1.0 |  | 6.8 |  |  | 4.6 | 0.5 | 11.7 |
| SrO | 6.5 |  | 5.5 | 15.6 |  |  | 6.8 | 0.8 |
| ZnO | 27.3 | 8.3 |  | 6.7 |  | 7.6 | 9.0 | 2.6 |
| MgO + CaO + SrO + ZnO | 34.8 | 17.7 | 22.8 | 22.3 | 1.2 | 16.4 | 23.9 | 15.1 |
| BaO |  |  |  |  |  |  |  |  |
| $ZrO_2$ |  |  |  |  |  |  |  |  |
| Average thermal expansion coefficient ($\times 10^{-7} K^{-1}$) | 94 | 90 | 89 | 101 | 90 | 86 | 103 | 99 |
| Emission of α-ray ($c/cm^2 \cdot h$) | 0.002 | 0.001 | 0.004 | 0.002 | 0.001 | 0.003 | 0.002 | 0.005 |
| Weather resistance (h) | 1512 | 1608 | 1680 | 1344 | 1440 | 1392 | 1560 | 1320 |

TABLE 5

|  | Ex. 29 | Ex. 30 | Ex. 31 | Ex. 32 | Comp. Ex. 21 | Comp. Ex. 22 | Comp. Ex. 23 | Comp. Ex. 24 |
|---|---|---|---|---|---|---|---|---|
| $P_2O_5$ | 25.1 | 27.4 | 29.0 | 22.6 | 35.5 | 26.4 | 49.9 | 44.0 |
| $Al_2O_3$ | 20.8 | 21.2 | 19.5 | 24.5 | 5.6 | 4.7 | 5.4 | 5.2 |
| $SiO_2$ | 0.5 |  |  |  |  |  |  | 5.0 |
| $B_2O_3$ | 2.8 | 7.3 | 1.3 |  |  |  | 8.8 | 3.3 |
| $Li_2O$ |  |  |  | 6.2 | 2.7 | 6.3 | 10.5 |  |
| $Na_2O$ | 12.7 | 8.8 |  | 10.0 | 6.2 | 5.2 | 5.2 | 21.0 |
| $K_2O$ | 7.0 | 10.8 | 11.1 | 8.4 | 3.3 | 5.3 | 2.1 | 1.3 |
| $Li_2O + Na_2O + K_2O$ | 19.7 | 19.6 | 17.3 | 18.4 | 12.2 | 16.8 | 17.8 | 22.3 |
| MgO | 21.2 | 8.0 |  | 6.6 | 3.6 | 31.7 | 5.0 |  |
| CaO | 5.3 | 7.9 | 9.0 |  | 4.8 |  | 1.2 | 20.5 |
| SrO |  | 3.1 | 14.6 | 5.4 |  |  |  |  |
| ZnO | 4.6 | 5.5 | 9.3 | 22.5 | 32.5 |  | 8.7 |  |
| MgO + CaO + SrO + ZnO | 31.1 | 24.5 | 32.9 | 34.5 | 40.9 | 31.7 | 14.9 | 20.5 |
| BaO |  |  |  |  | 5.8 | 11.6 | 7.9 |  |
| $ZrO_2$ |  |  |  |  |  |  | 0.8 | 3.0 |
| Average thermal | 108 | 110 | 106 | 105 | 97 | 115 | 98 | 109 |

TABLE 5-continued

| | Ex. 29 | Ex. 30 | Ex. 31 | Ex. 32 | Comp. Ex. 21 | Comp. Ex. 22 | Comp. Ex. 23 | Comp. Ex. 24 |
|---|---|---|---|---|---|---|---|---|
| expansion coefficient ($\times 10^{-7} K^{-1}$) | | | | | | | | |
| Emission of α-ray ($c/cm^2 \cdot h$) | 0.004 | 0.004 | 0.005 | 0.002 | 0.059 | 0.078 | 0.017 | 0.035 |
| Weather resistance (h) | 1488 | 1464 | 1440 | 1632 | 864 | 744 | 816 | 792 |

As is evident from Tables 4 and 5, glasses in Comparative Examples 21 to 24 are poor in the weather resistance at a level of less than 900 hours, as compared with glasses in Examples 21 to 32. A reason is considered to be such that $Al_2O_3$ component in glass is less. Further, another reason is considered to be such that $P_2O_5$ component is excessive in Comparative Examples 23 and 24. Further, the glasses in Comparative Examples 21 to 24 contain BaO or $ZrO_2$ in glass, and it is evident that the emission of α-rays from the glass is high as compared with the glasses in Examples.

[Strength of Glass, and UV-Permeability]

Further, the strength (cracking resistance) and the UV-permeability of glass were evaluated with respect to the following Examples. Here, the respective evaluation methods were the same as the above-described methods.

Figure 2:
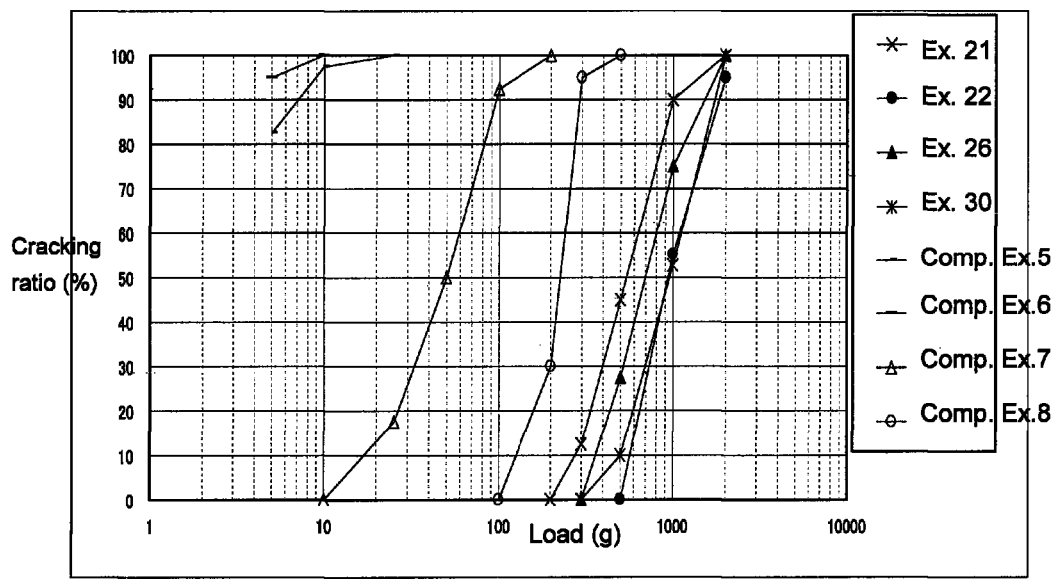
FIG. 2 is a graph showing a relation between the glass composition (low thermal expansion type composition) and the incidence of cracking.

The cracking resistance was evaluated with respect to glasses in Examples 21, 22, 26 and 30. The evaluation results are shown in FIG. 2. Further, the above-mentioned evaluation results in Comparative Examples 5 to 8 are also shown.

As is evident from FIG. 2, when the cracking ratios are compared between the low expansion type glass of the present invention and the fluorophosphate glass (Comparative Example 5 or 6) disclosed in JP-A-2005-353718, no cracking is observed in the glass of the present invention under a load where the cracking ratio is high with the fluorophosphate glass in Comparative Example 5 or 6, thus indicating that the glass of the present invention has higher cracking resistance and higher strength.

Further, when the cracking ratios are compared between the glass of the present invention with a low thermal expansion type composition and the borosilicate glass (Comparative Example 7 or 8) disclosed in JP-A-8-306894, the cracking ratio is low with the glass of the present invention under a load where the cracking ratio is high with the borosilicate glass in Comparative Example 7 or 8, thus indicating that the glass of the present invention has higher cracking resistance and higher strength. That is, it has been confirmed that as compared with conventional glasses, the glass of the present invention has high strength and is less likely to undergo breakage at the time when an external force is exerted.

The UV permeability was evaluated with respect to the glass in Example 24. In the case where the cover glass in Example 24 was used, the time required for the bonding of the cover glass was shorter by about 40% as compared with the case where the cover glass in Comparative Example 5 or 7 was used. This is considered to be such that since the glass in Comparative Example 5 or 7 contains CuO as a constituting component, the ultraviolet wavelengths required for curing of the ultraviolet-curable adhesive were absorbed by the glass, and the amount of ultraviolet rays reaching the ultraviolet-curable adhesive was less. Whereas, with the glass in the Example of the present invention containing no CuO, there is no absorption of ultraviolet rays by the glass, and it is possible to readily cure the ultraviolet-curable adhesive and efficiently carry out the process for assembling the imaging device.

INDUSTRIAL APPLICABILITY

According to the present invention, it is possible to provide a cover glass for a solid-state imaging element package, which is useful for air-tight sealing of a resin package and which has a sufficient strength not to undergo breakage even when subjected to an external force and also has a good weather resistance.

This application is a continuation of PCT Application No. PCT/JP2010/057973, filed May 11, 2010, which is based upon and claims the benefit of priority from Japanese Patent Application No. 2009-116425 filed on May 13, 2009. The contents of those applications are incorporated herein by reference in its entirety.

What is claimed is:

1. A cover glass, comprising, by mole percentage:
$P_2O_5$: 15 to 40%;
$Al_2O_3$: 15 to 30%;
$SiO_2$: 0 to 15%;
$B_2O_3$: 0 to 20%;
$Li_2O$: 0 to 10%;
$Na_2O$: 0 to less than 20%;
$K_2O$: 0 to less than 20%, provided that
$Li_2O+Na_2O+K_2O$: 15 to less than 20%; and
$MgO+CaO+SrO+ZnO$: 1 to 35%.

2. The cover glass claim 1, having an average thermal expansion coefficient of from 85 to $110 \times 10^{-7} K^{-1}$ within a range of from 50 to 250° C.

3. The cover glass of claim 1, containing substantially no CuO.

4. The cover glass of claim 1, comprising:
$P_2O_5$: 25 to 35 mol %.

5. The cover glass of claim 1, comprising:
$Al_2O_3$: 17 to 27 mol %.

6. The cover glass of claim 1, comprising:
$Al_2O_3$: 20 to 27 mol %.

7. The cover glass of claim 1, comprising:
$SiO_2$: 0 to 12 mol %.

8. The cover glass of claim 1, comprising:
$B_2O_3$: 0 to 15 mol %.

9. The cover glass of claim 1, comprising:
$Li_2O$: 0 to 7 mol %.

10. The cover glass of claim 1, comprising:
$Na_2O$: 0 to less than 15%.

11. The cover glass of claim 1, comprising:
$K_2O$: 0 to less than 15%.

12. The cover glass of claim 1, comprising:
$Li_2O$: 0 to 7 mol %;
$Na_2O$: 0 to less than 15%; and
$K_2O$: 0 to less than 15%, provided that
$Li_2O+Na_2O+K_2O$: 17 to less than 19%.

13. The cover glass of claim 1, comprising:
MgO+CaO+SrO+ZnO: 10 to 25%.

14. The cover glass of claim 1, further comprising:
at least one selected from the group consisting of $La_2O_3$, $Y_2O_3$, $Gd_2O_3$, $Ta_2O_5$, $Yb_2O_3$, $TiO_2$.

15. The cover glass of claim 1, containing substantially no BaO.

16. The cover glass of claim 1, containing substantially no $ZrO_2$.

17. The cover glass of claim 1, comprising:
$P_2O_5$: 25 to 35 mol %;
$Al_2O_3$: 17 to 27 mol %;
$SiO_2$: 0 to 12 mol %;
$B_2O_3$: 0 to 15 mol %;
$Li_2O$: 0 to 7 mol %;
$Na_2O$: 0 to less than 15%;
$K_2O$: 0 to less than 15%, provided that
$Li_2O+Na_2O+K_2O$: 17 to less than 19%; and
MgO+CaO+SrO+ZnO: 10 to 25%.

18. The cover glass of claim 17, having an average thermal expansion coefficient of from 85 to $110\times10^{-7}K^{-1}$ within a range of from 50 to 250° C.

19. The cover glass of claim 17, containing substantially no CuO.

20. The cover glass of claim 1, being suitable for a solid-state imaging element package which is to be attached to a resin package.

\* \* \* \* \*